United States Patent
Sang

(10) Patent No.: US 7,053,452 B2
(45) Date of Patent: May 30, 2006

(54) METAL OXIDE SEMICONDUCTOR DEVICE FOR ELECTROSTATIC DISCHARGE PROTECTION CIRCUIT

(75) Inventor: Steven Sang, Jhonghe (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/710,931

(22) Filed: Aug. 13, 2004

(65) Prior Publication Data
US 2006/0033162 A1 Feb. 16, 2006

(51) Int. Cl.
*H01L 23/62* (2006.01)

(52) U.S. Cl. .................. 257/362; 257/355; 257/360
(58) Field of Classification Search ........ 257/355–356, 257/360, 362, 546
See application file for complete search history.

(56) References Cited

U.S. PATENT DOCUMENTS

| | | | |
|---|---|---|---|
| 5,158,899 A * | 10/1992 | Yamagata | 438/529 |
| 5,932,914 A * | 8/1999 | Horiguchi | 257/355 |
| 6,303,964 B1 * | 10/2001 | Pulvirenti et al. | 257/355 |
| 6,399,990 B1 * | 6/2002 | Brennan et al. | 257/355 |
| 6,424,013 B1 * | 7/2002 | Steinhoff et al. | 257/355 |
| 6,630,719 B1 * | 10/2003 | Roche | 257/393 |
| 6,855,611 B1 * | 2/2005 | Chen et al. | 438/309 |
| 2004/0164354 A1 * | 8/2004 | Mergens et al. | 257/355 |

* cited by examiner

*Primary Examiner*—Allan R. Wilson
(74) *Attorney, Agent, or Firm*—Jiang Chyun IP Office

(57) ABSTRACT

A MOS device for an electrostatic discharge protection circuit provided. A gate structure is disposed on the substrate. A source region and a drain region are formed in the substrate beside the gate structure. A doped layer is disposed underneath the source region and the drain region within the substrate but apart from the source region and the drain region. An extended doped region is disposed within the substrate adjacent to the doped layer and the source region. Two parasitic bipolar junction transistors (BJT) are formed in the MOS device. One BJT includes the drain region, the substrate and the source region. Another BJT includes the drain region, the substrate and the doped layer. A discharge current flowing into the drain region is channeled to a common voltage terminal via these two parasitic bipolar junction transistors.

13 Claims, 2 Drawing Sheets

METAL OXIDE SEMICONDUCTOR DEVICE FOR ELECTROSTATIC DISCHARGE PROTECTION CIRCUIT

BACKGROUND OF INVENTION

1. Field of the Invention

The present invention relates to a semiconductor device. More particularly, the present invention relates to a metal-oxide-semiconductor device for an electrostatic discharge protection circuit.

2. Description of Related Art

Electrostatic discharge is a phenomenon caused by the movement of static electricity from the surface of a non-conductive object. A human walking over a carpet may generate several hundred to several thousand volts of static electricity even if the ambient relative humidity (RH) is high. More than ten thousand volts may be produced if the surrounding relativity humidity is low. A typical station for packaging or testing semiconductor devices may be charged from several hundred up to several thousand volts of static electricity in an unscreened environment. Therefore, when the aforementioned charged body (a human body or a station) is in contact with a wafer, static electricity may discharge through the wafer in an electrostatic discharge (ESD). The sudden surge in power during the electrostatic discharge is often a main cause for the damage of semiconductor devices on the wafer.

To protect the semiconductor devices on a wafer against possible electrostatic discharge, various types of electrostatic discharge protection methods have been developed. The most common method deploys special hardware to clamp down the discharge. In other words, an electrostatic discharge protection circuit is set up between an internal circuit and each bonding pad. In general, a metal-oxide-semiconductor (MOS) transistor whose gate is grounded is used as a clamping device for ESD.

FIG. 1 is a schematic cross-sectional view of the MOS device for a conventional ESD protection circuit. The MOS device in FIG. 1 includes a p-type substrate 100, a gate structure 102, an n-type source region 104a and an n-type drain region 104b. The gate structure 102 is disposed on the substrate 100. The gate structure 102 includes a gate dielectric layer 106 and a gate conductive layer 108. The gate conductive layer 108 is disposed over the substrate 100 and the gate dielectric layer 106 is sandwiched between the substrate 100 and the gate conductive layer 108. The n-type source region 104a and the n-type drain region 104b are disposed within the substrate 100 on each side of the gate structure 102. Furthermore, the gate structure 102 and the source region 104a are coupled to a common voltage terminal 110.

In the aforementioned MOS device, the drain region 104b, the substrate 100 and the source region 104a together form a parasitic bipolar junction transistor (BJT) 112. The drain region 104b is the collector, the substrate is the base and the source region 104a is the emitter of the bipolar junction transistor 112. Consequently, the discharge current $I_{ESD}$ in an ESD entering through the drain region 104b can be channeled to the common voltage terminal 110 (for example, a ground terminal) via the parasitic bipolar junction transistor 112.

However, with just one parasitic bipolar junction transistor connected to the MOS device, the parasitic bipolar junction transistor may be overloaded when an excessive discharge current and flows into the ESD protection circuit. Ultimately, the ESD protection circuit may fail to protect the internal devices.

SUMMARY OF INVENTION

Accordingly, the present invention is directed to a metal-oxide-semiconductor (MOS) device for an electrostatic discharge (ESD) protection circuit capable of protecting internal devices even if an excessive ESD current is discharged through the ESD protection circuit.

According to an embodiment of the present invention, the metal-oxide-semiconductor (MOS) device for an electrostatic discharge (ESD) protection circuit comprises a first conductive type substrate, a gate structure, a second conductive type source region, a second conductive type drain region, a second conductive type doped layer and a second conductive type extended doped region. The gate structure is disposed over the substrate. The second conductive type source region and the second conductive type drain region are separately disposed in the substrate on each side of the gate structure. The second conductive type doped layer is disposed within the substrate underneath the source region and the drain region but apart from the source region and the drain region. The second conductive type extended doped region is disposed within the substrate. Furthermore, the extended doped region is adjacent to the doped layer and the source region. The drain region, the substrate and the source region together form a first parasitic bipolar junction transistor (BJT) and the drain region, the substrate and the doped layer together form a second parasitic bipolar junction transistor (BJT). Therefore, a current flowing into the drain region is channeled to a common voltage terminal via these two parasitic bipolar junction transistors.

Since the MOS device in the electrostatic discharge protection circuit according to an embodiment of the present invention includes two parasitic bipolar junction transistors instead of one parasitic bipolar junction transistor in the conventional design; the capacity to discharge an ESD current is significantly increased.

According to another embodiment of the present invention, the metal-oxide-semiconductor (MOS) device for an electrostatic discharge (ESD) protection circuit comprises a first conductive type substrate, a plurality of parallel connected transistors, a second conductive type doped layer and a second conductive type extended doped region. The parallel-connected transistors are disposed over the substrate. Each transistor includes a gate structure, a second conductive type drain region and a second conductive type source region. The gate structure is disposed over the substrate while the source region and the drain region are separately disposed in the substrate on each side of the gate structure. The second conductive type doped layer is disposed within the substrate underneath the source region and the drain region but apart from the source region and the drain region. The second conductive type extended doped region is disposed within the substrate. Furthermore, the extended doped region is adjacent to the doped layer and the source region of the outmost transistors among the parallel-connected transistors. The drain region, the substrate and the source region of each transistor together form at least a first parasitic bipolar junction transistor (BJT) and the drain region, the substrate and the doped layer of each transistor together form at least a second parasitic bipolar junction transistor (BJT). Therefore, a current flowing into the drain region of each transistor is channeled to a common voltage terminal via these two parasitic bipolar junction transistors.

Since the MOS device in the electrostatic discharge protection circuit according to an embodiment of the present invention includes a plurality of parasitic bipolar junction transistors instead of one parasitic bipolar junction transistor in the conventional design; the capacity to discharge an ESD current is significantly increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The following drawings illustrate embodiments of the invention and, together with the description, serve to explain the principles of the invention.

DETAILED DESCRIPTION

Figure 1:
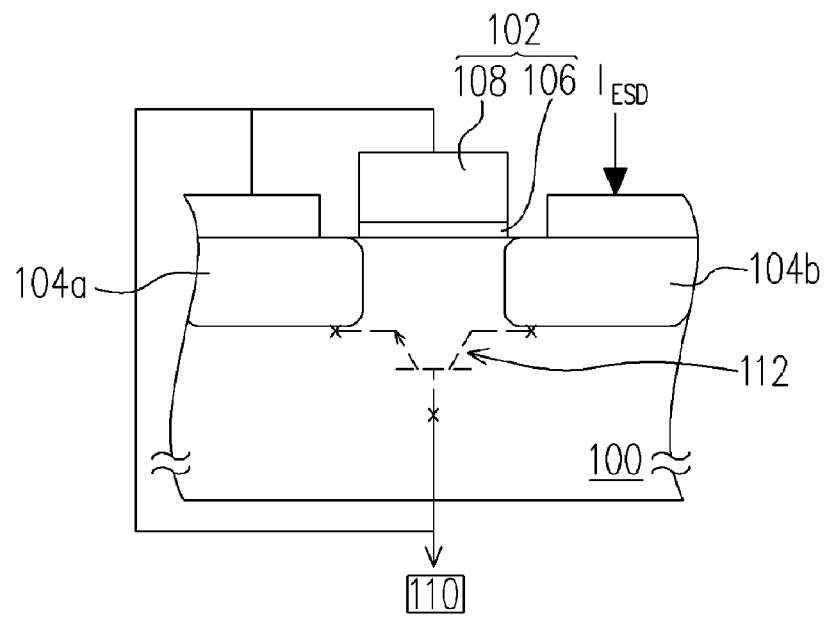
FIG. 1 is a schematic cross-sectional view of the MOS device of a conventional ESD protection circuit.

Reference will now be made in detail to the present preferred embodiments of the invention, examples of which are illustrated in the accompanying drawings. Wherever possible, the same reference numbers are used in the drawings and the description to refer to the same or like parts.

In the following embodiment of the present invention, a first conductive type layer refers to a p-doped material layer and a second conductive type layer refers to an n-doped material layer. However, anyone familiar with semiconductor fabrication may notice that the first and the second conductive type material can be interchanged. Therefore, in the following, description of a structure whose constituent materials are of the opposite dopant types is omitted.

Figure 2:
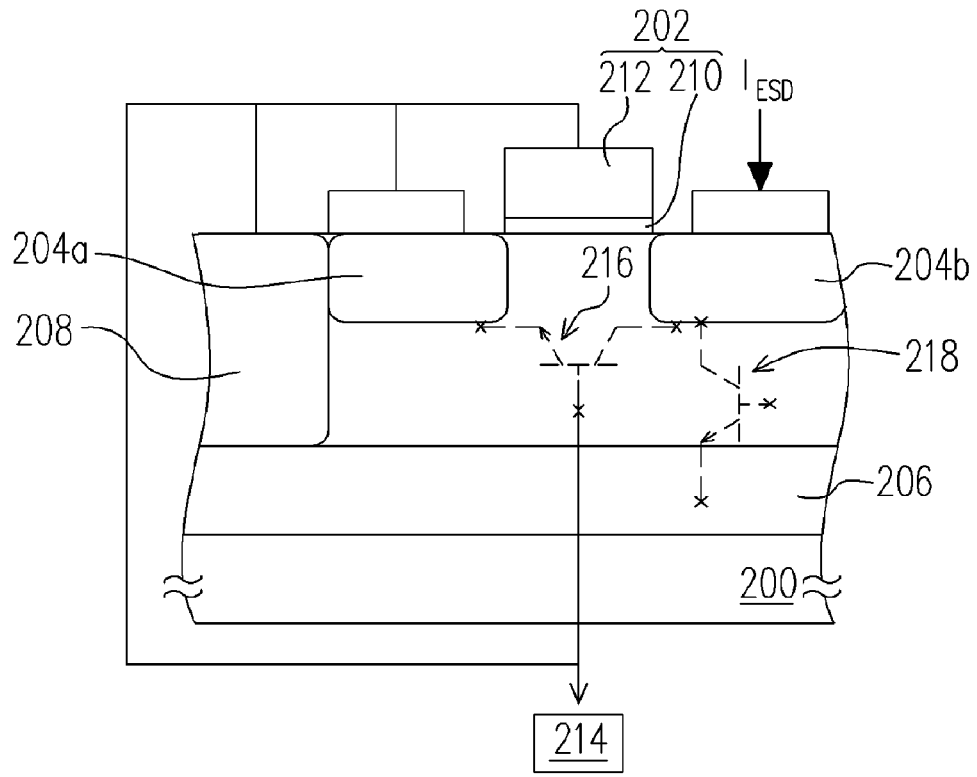
FIG. 2 is a schematic cross-sectional view of a MOS device for an ESD protection circuit according to one embodiment of the present invention.

FIG. 2 is a schematic cross-sectional view of a MOS device for an ESD protection circuit according to one embodiment of the present invention. The MOS device in FIG. 2 is used as a ground connected clamping device in an ESD protection circuit. The MOS device mainly includes a p-type substrate 200, a gate structure 202, an n-type source region 204a, an n-type drain region 204b, an n-doped layer 206 and an n-type extended doped region 208.

The gate structure 202 is disposed over the p-type substrate 200. The gate structure 202 includes a gate dielectric layer 210 and a gate conductive layer 212. The gate dielectric layer 210 is, for example, a silicon oxide, silicon nitride or other dielectric layer. The gate conductive layer 212 is, for example, a polysilicon, a doped polysilicon or other suitable conductive material layer. The n-type source region 204a and the n-type drain region 204b are separately disposed in the p-type substrate 200 on each side of the gate structure 202.

The n-doped layer 206 is disposed within the p-type substrate 200 underneath the n-type source region 204a and the n-type drain region 204b but apart from the n-type source region 204a and the n-type drain region 204b. The n-doped layer 206 is a deep n-well within the p-type substrate 200, for example. The n-type extended doped region 208 is adjacent to the n-doped layer 206 and the n-type source region 204a. Furthermore, the n-type extended doped region 208 is located within the n-well of the p-type substrate 200. In addition, the aforementioned p-type substrate 200, the gate structure 202, the n-type source region 204a and the n-type extended doped region 208 are coupled to the a common voltage terminal 214 (for example, a ground terminal).

The n-type drain region 204b, the p-type substrate 200 and the n-type source region 204a together form an npn parasitic bipolar junction transistor 216. The n-type drain region 204b is the collector, the p-type substrate 200 is the base and the n-type source region 204a is the emitter of the parasitic bipolar junction transistor 216. Similarly, the n-type drain region 204b, the p-type substrate 200 and the n-doped layer 206 together form another npn parasitic bipolar junction transistor 218. The n-type drain region 204b is the collector, the p-type substrate 200 is the base and the n-doped layer 206 is the emitter of the parasitic bipolar junction transistor 218.

Thus, the electrostatic discharge current $I_{ESD}$ flowing into the n-type drain region 204b is channeled to the common voltage terminal 214 via the two parasitic bipolar junction transistors 216 and 218. Compared with the conventional ESD protection circuit fabricated using a device having only a single bipolar junction transistor, the MOS device of the present invention provides a significant improvement in ESD protection.

Figure 3:
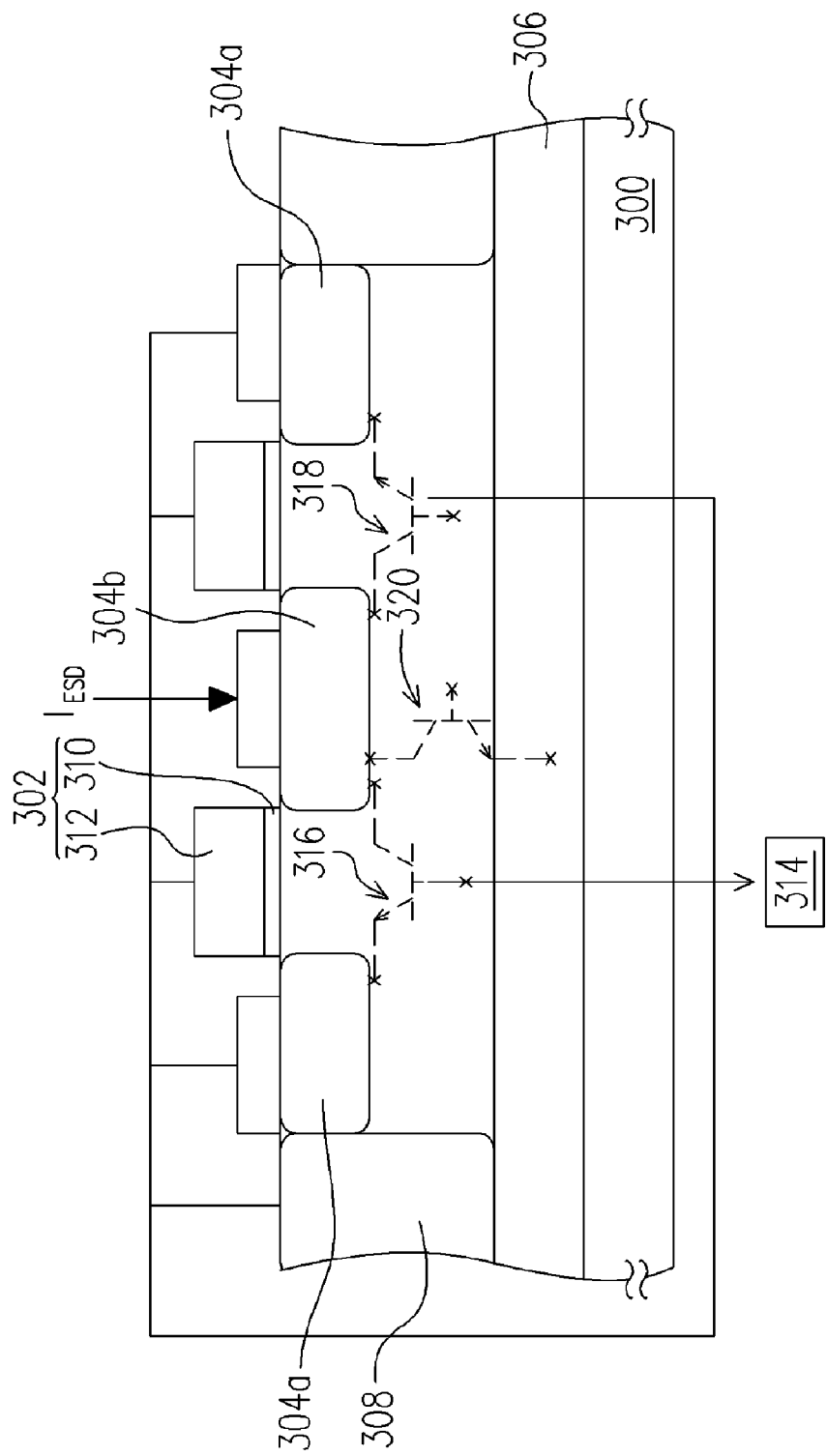
FIG. 3 is a schematic cross-sectional view of another MOS device for an ESD protection circuit according to one embodiment of the present invention.

FIG. 3 is a schematic cross-sectional view of another MOS device for an ESD protection circuit according to one embodiment of the present invention. In the embodiment shown in FIG. 3, two parallel-connected transistors are formed in the substrate. However, the scope of the present invention is not limited as such because other types of arrangements such as three or more parallel-connected transistors can be used. The MOS device is used as a ground connected clamping device in an ESD protection circuit. The MOS device mainly includes a p-type substrate 300, a pair of transistors, an n-doped layer 306 and an n-type extended doped region 308. Furthermore, each transistor includes a gate structure 302, an n-type source region 304a and an n-type drain region 304b.

The gate structure 302 is disposed on the p-type substrate 300. The gate structure 302 includes a gate dielectric layer 310 and a gate conductive layer 312. The gate dielectric layer 310 is, for example, a silicon oxide, silicon nitride or other dielectric layer. The gate conductive layer 312 is, for example, a polysilicon, a doped polysilicon or other suitable conductive material layer. The n-type source region 304a and the n-type drain region 304b are separately disposed in the p-type substrate 300 on each side of the gate structure 302. In the present embodiment, the neighboring pair of transistors uses the same n-type drain 304b. Obviously, in another embodiment, the neighboring pair of transistors may use the same n-type source 304a.

The n-doped layer 306 is disposed within the p-type substrate 300 underneath the transistors but apart from the n-type source region 304a and the n-type drain region 304b. The n-doped layer 306 is a deep n-well within the p-type substrate 300, for example. The n-type extended doped region 308 is adjacent to the n-doped layer 306 and the n-type source region 304a of the transistors. Furthermore, the n-type extended doped region 308 is located within the n-well of the p-type substrate 300. In addition, the aforementioned p-type substrate 300 and the gate structure 302, the n-type source region 304a and the n-type extended doped region 308 of each transistor are coupled to the a common voltage terminal 314 (for example, a ground terminal).

The n-type drain region 304b, the p-type substrate 300 and the n-type source region 304a of each transistor form a pair of npn parasitic bipolar junction transistors 316, 318. The n-type drain region 304b is the collector, the p-type substrate 300 is the base and the n-type source region 304a is the emitter of the parasitic bipolar junction transistor 216. Similarly, the n-type drain region 304b, the p-type substrate 300 and the n-doped layer 306 of each transistor form another npn parasitic bipolar junction transistor 320. The n-type drain region 304b is the collector, the p-type substrate 300 is the base and the n-doped layer 306 is the emitter of the parasitic bipolar junction transistor 320.

Thus, the electrostatic discharge current $I_{ESD}$ flowing into the n-type drain region 304b of each transistor is channeled to the common voltage terminal 314 via the two parasitic bipolar junction transistors 316,318 and 320. Compared with the conventional ESD protection circuit fabricated using a device having only a single bipolar junction transistor, the MOS device of the present invention provides a significant improvement in ESD protection.

In the aforementioned embodiment, two parallel-connected transistors are used. However, anyone familiar with the technologies may notice that more than two parallel-connected MOS devices are often deployed in most ESD protection circuits. Hence, the present invention provides more internal parasitic bipolar junction transistors and expands the ESD protection capacity.

In summary, the present invention at least includes the following advantages:

1. Several parasitic bipolar junction transistors instead of a single parasitic bipolar junction transistor are used in the MOS device forming the ESD protection circuit so that the ESD protection circuit can have a higher ESD protection capacity.

2. The MOS device in the ESD protection circuit has a size and structure similar to the one in a conventional ESD protection circuit. Therefore, a higher ESD protection is obtained without any reduction in the original level of integration.

3. The process of fabricating the MOS device is compatible with a conventional MOS fabrication process. Hence, the MOS device of the present invention can be made without incurring any extra cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A metal-oxide-semiconductor (MOS) device for an electrostatic discharge (ESD) protection circuit with the MOS device serving as a clamping device in the ESD protection circuit, comprising:
   a first conductive type substrate;
   a gate structure, disposed over the substrate;
   a second conductive type source region and a second conductive type drain region, separately disposed in the substrate on each side of the gate structure;
   a second conductive type doped layer, disposed in the substrate underneath the source region and the drain region but apart from the source region and the drain region; and
   a second conductive type extended doped region, disposed in the substrate directly adjacent to the doped layer and the source region;
   wherein, under a circuit connection, the drain region, the substrate and the source region together form a first parasitic bipolar junction transistor (BJT) and the drain region, the substrate and the doped layer together form a second parasitic bipolar junction transistor so that a current flowing into the drain region is channeled to a same common voltage terminal via the first parasitic BJT and the second parasitic BJT.

2. The MOS device of claim 1, wherein the substrate, the gate structure, the source region and the extended doped region are coupled to the common voltage terminal.

3. The MOS device of claim 1, wherein the first conductive type is a p-doped material and the second conductive type is an n-doped material.

4. The MOS device of claim 1, wherein the first conductive type is an n-doped material and the second conductive type is a p-doped material.

5. The MOS device of claim 1, wherein the gate structure comprises a bottom gate dielectric layer and a top gate conductive layer.

6. The MOS device of claim 1, wherein the common voltage is a ground voltage.

7. A metal-oxide-semiconductor (MOS) device for an electrostatic discharge (ESD) protection circuit with the MOS device serving as a clamping device, comprising:
   a first conductive type substrate;
   a plurality of parallel-connected transistors, disposed on the substrate with each transistor having:
   a gate structure disposed over the substrate;
   a second conductive type source region and a second conductive type drain region, separately disposed in the substrate on each side of the gate structure;
   a second conductive type doped layer, disposed in the substrate underneath the transistors but apart from the source regions and the drain regions; and
   a second conductive type extended doped region, disposed in the substrate directly adjacent to the doped layer and the source region of the outmost transistors among the parallel-connected transistors;
   wherein, under a circuit connection, the drain region, the substrate and the source region of the various transistors form at least a first parasitic bipolar junction transistor and at least one the drain region of the various transistors, the substrate and the doped layer form at least a second parasitic bipolar junction transistor so that currents flowing into various drain regions of the transistors are channeled to a same common voltage terminal via the first parasitic bipolar junction transistor and the second parasitic bipolar junction transistor.

8. The MOS device of claim 7, wherein the substrate and the gate structure, the source region, the extended doped region of the transistors are coupled to the common voltage terminal.

9. The MOS device of claim 7, wherein the first conductive type is a p-doped material and the second conductive type is an n-doped material.

10. The MOS device of claim 7, wherein the first conductive type is an n-doped material and the second conductive type is a p-doped material.

11. The MOS device of claim 7, wherein the gate structure comprises a bottom gate dielectric layer and a top gate conductive layer.

12. The MOS device of claim 7, wherein every adjacent pair of transistors either uses a common source region or a common drain region.

13. The MOS device of claim 7, wherein the common voltage is a ground voltage.

* * * * *